(12) United States Patent
Raynham (10) Patent No.: US 6,493,843 B1
(45) Date of Patent: Dec. 10, 2002

(54) CHIPKILL FOR A LOW END SERVER OR WORKSTATION

(75) Inventor: Michael B. Raynham, Los Gatos, CA (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/429,749

(22) Filed: Oct. 28, 1999

(51) Int. Cl.$^7$ .................. G11C 29/00; H03M 13/00
(52) U.S. Cl. ........................... 714/763; 714/774
(58) Field of Search .................. 714/763, 758, 714/764, 766, 773, 774

(56) References Cited

U.S. PATENT DOCUMENTS

| | | | | |
|---|---|---|---|---|
| 3,585,378 A | * | 6/1971 | Bouricius et al. | 365/201 |
| 5,058,116 A | * | 10/1991 | Chao et al. | 714/761 |
| 5,335,234 A | * | 8/1994 | Matteson et al. | 714/756 |
| 5,379,304 A | * | 1/1995 | Dell et al. | 714/758 |
| 5,465,262 A | * | 11/1995 | Dell et al. | 714/800 |
| 5,481,552 A | * | 1/1996 | Aldereguia et al. | 714/773 |
| 5,623,506 A | * | 4/1997 | Dell et al. | 714/756 |
| 6,003,144 A | * | 12/1999 | Olarig et al. | 714/42 |
| 6,233,716 B1 | * | 5/2001 | Cypher | 714/777 |
| 6,304,992 B1 | * | 10/2001 | Cypher | 711/100 |

OTHER PUBLICATIONS

"IBM—32M x 72 Chipkill Correct DRAM Module" (visited Oct. 27, 1999) <http://www.chips.ibm.com/products/memory/20L9836/toc.html>.

* cited by examiner

Primary Examiner—Albert Decady
Assistant Examiner—Joseph D. Torres (57) ABSTRACT

The present invention provides a process and memory configuration for providing chipkill error detection in a low end server without requiring non-standard components or additional memory devices. Typically, the number of error correction bits required for chipkill functionality is dependent on the width of the memory chip to be corrected and the CRC algorithm that is used. If the required number of error correction bits is not provided by the memory system, another option according to the present invention, is to perform doubleword operation for consecutive memory locations in a single DIMM module. Reading the memory module in double words basically provides the system with double its previous number of ECC bits per data transfer. Since these low end systems would typically not have the number of error correction bits necessary to do the chipkill operation, this double word technique allows chipkill for low end systems which would normally not be able to perform the chipkill operation.

9 Claims, 6 Drawing Sheets

CHIPKILL FOR A LOW END SERVER OR WORKSTATION

CROSS REFERENCE TO RELATED APPLICATION

The applications entitled "Self-Healing Memory System for High Availability Server", identified by HP Docket Number 10991629 and the inventor Michael B. Raynham and James G. Mathios, filed Oct. 28, 1999 and "Radial Arm Memory Bus for a High Availability Computer System" identified by HP Docket Number 10991678 and the inventors Michael B. Raynham and Hans Wiggers, filed Oct. 28, 1999 include subject matter related to the copending application.

BACKGROUND OF THE INVENTION

Available memory systems are constantly expanding in size with time, with current server memory systems often being in the range of up to 64 Gbytes (approximately half a trillion storage bits) or larger for high end servers. Dependent on the customer requirements, the customer may choose to purchase a low end or high end server. Current low end server systems typically include one to four dual in line memory modules (DIMMs) while a high end servers typically include four or more DMMs. Typically, high end servers also include high availability features such as memory chip redundancy, hot swapping, and the ability to do chipkill error correction.

Figure 1A:
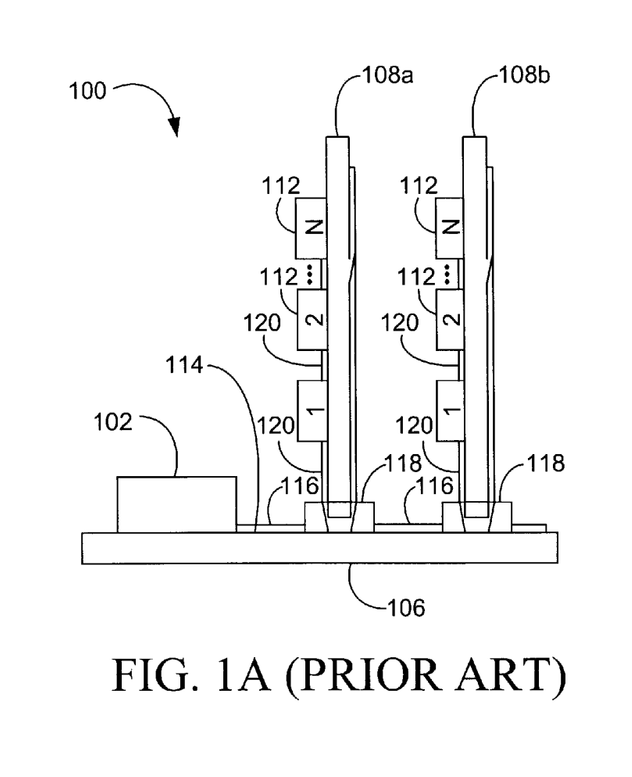
FIG. 1A shows a side view of a memory system for a low end server system that includes two DIMM modules.

Referring to FIG. 1A shows a side view of a memory system for a low end server system 100. The memory system includes a CPU or memory controller 102 affixed to a motherboard 106 and two dual in line memory modules 108a and 108b. The two memory modules 108a–b shown each includes N memory devices 112 connected in parallel. Assuming for purposes of discussion that N is equal to eighteen, the eighteen memory devices 112a-N on each memory module 108a and 108b are connected to the memory controller 102 by a data bus 114, which includes board trace portions 116, a connectors 118 and a module trace portions 120.

Figure 1B:
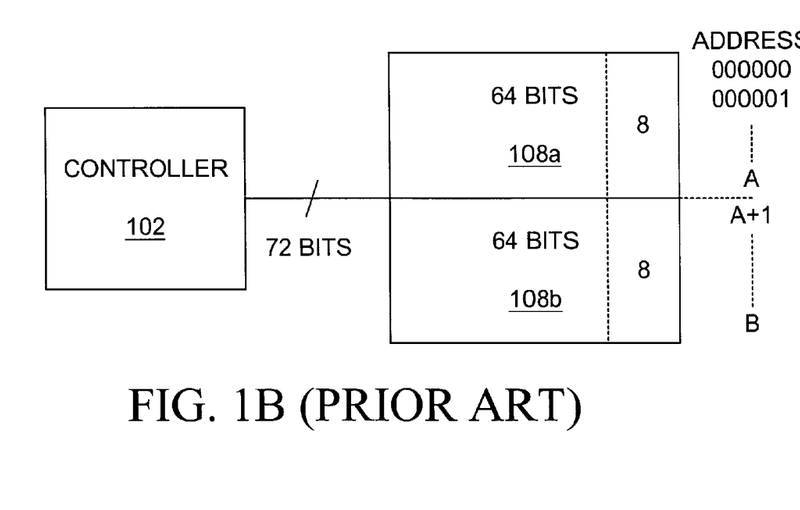
FIG. 1B shows a block diagram of the memory structure of the memory modules of the low end server shown in FIG. 1A.

FIG. 1B shows a block diagram of the memory structure of the memory modules of the low end server shown in FIG. 1A. In the embodiment shown in FIG. 1B, the data bus is 72 bits wide where 64 bits are used for data and 8 bits are used for error correction. Each of the eighteen memory devices on the memory module 108a–b is 4 bits wide and for a 256 Mbyte system each of the eighteen×4 SDRAMs is 32 Mbyte. The eighteen×4 memory devices are connected in parallel so that for each memory operation, the output onto the data bus 114 is 72 bits wide.

Figure 1C:
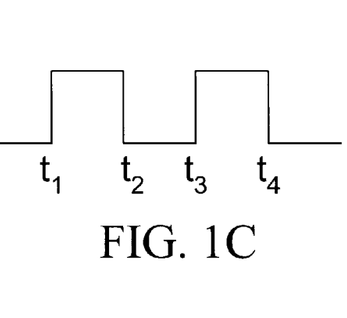
FIG. 1C shows a clock signal for reading or writing to a memory location of the low end server shown in FIG. 1A.

Referring to FIG. 1C shows a clock pulse for reading or writing to a memory location of the low end server shown in FIG. 1A. The memory controller reads a single word or memory location from a single memory module at a time. Assuming a single data rate (SDR) system and a read operation, the memory location in memory module 108 having the address 000000 is read at the clock edge $t_1$. The contents of the memory location is 72 bits wide. No memory operation occurs at clock edge $t_2$. A second memory location having the address location 000001 in memory module 108 is read at the clock edge t3.

Figure 2A:
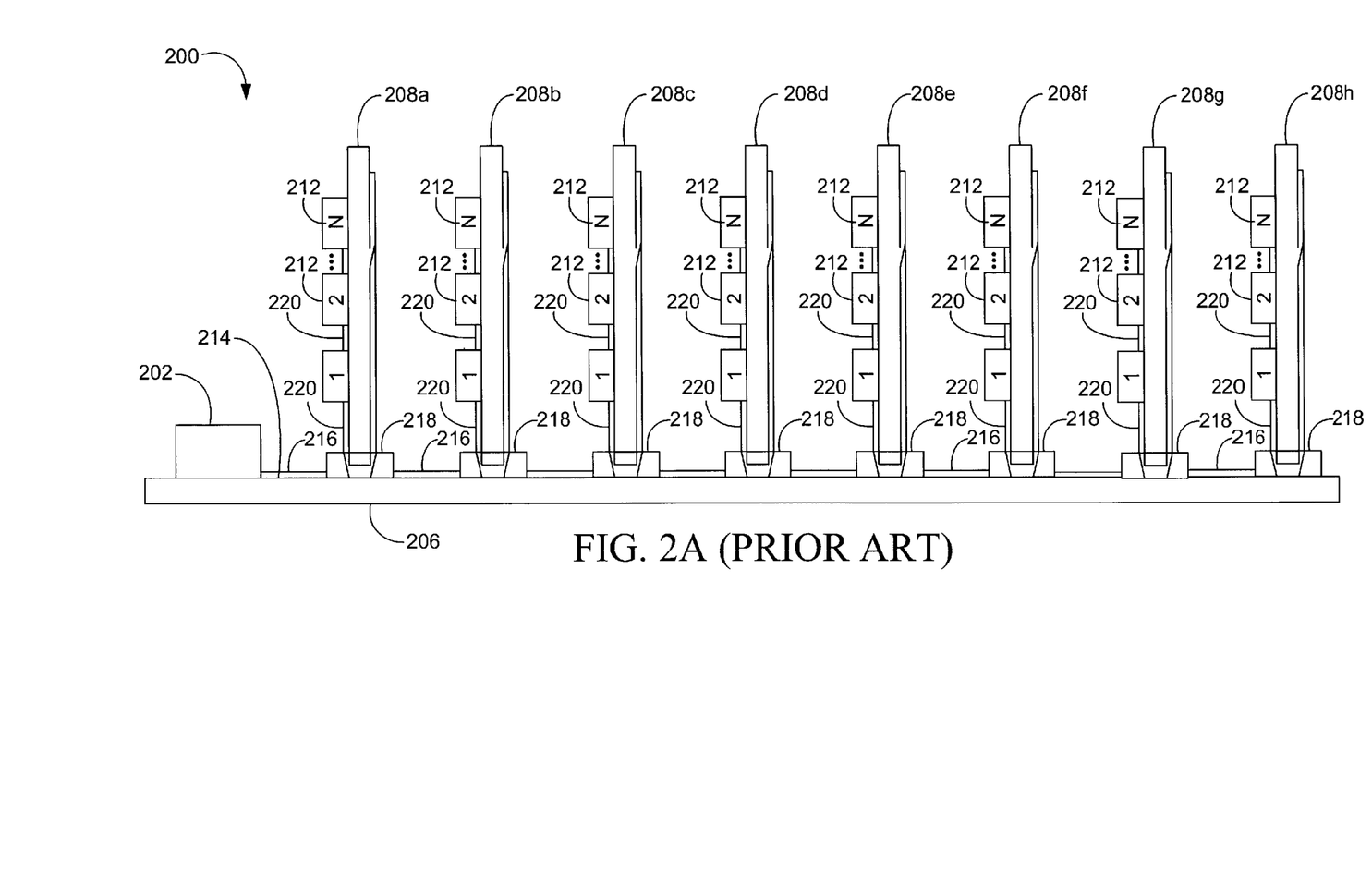
FIG. 2A shows a side view of a memory system for a conventional high end server system 200 having eight DIMM modules.

FIG. 2A shows a side view of a memory system for a conventional high end server system 200 having eight DIMM modules. Similar to the low end server configuration shown In FIG. 1A, the memory system shown in FIG. 2A includes a CPU or memory controller 202 affixed to a motherboard 206. However, the high end configuration Includes eight dual in line memory modules 208a–h instead of the two DIMMs 108a–b shown in FIG. 1A. The eight memory modules 208a shown each includes N memory devices 212, The memory controller 202 is connected to the eight memory modules 208a–h by a data bus 214, which includes board trace portions 216, connectors 218 and module trace portions 220.

Figure 2B:
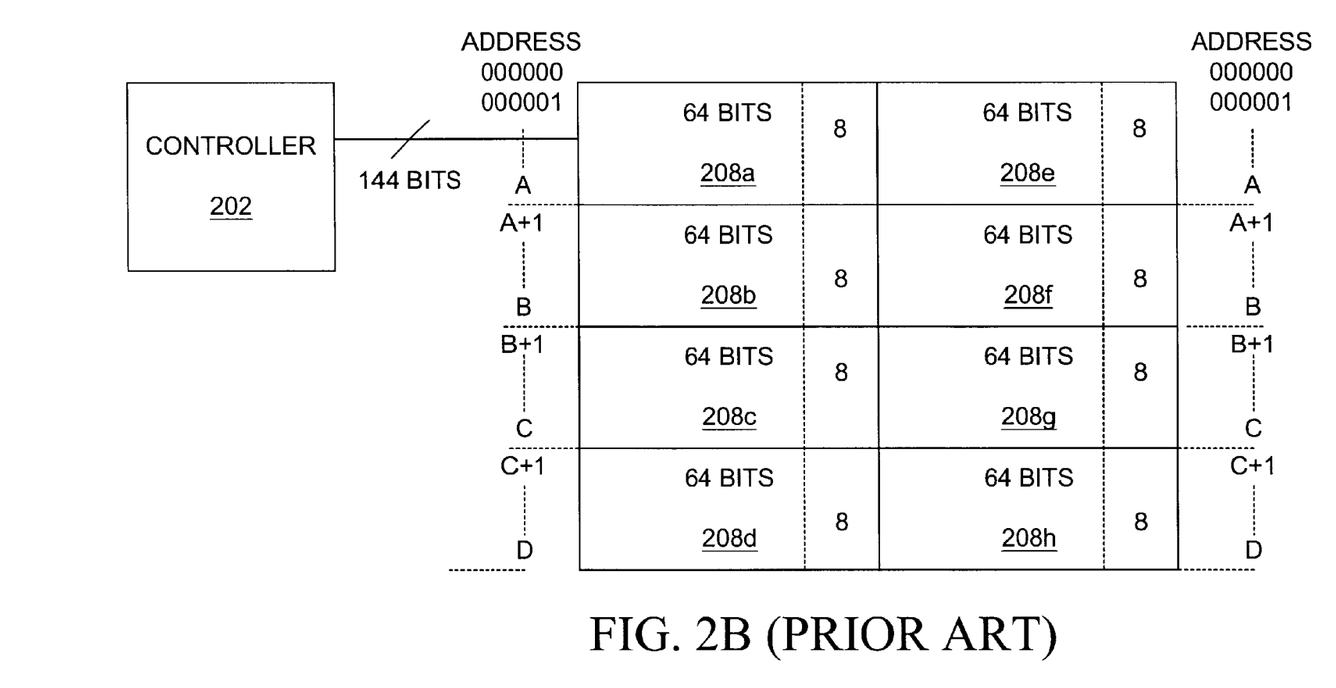
FIG. 2B shows a block diagram of the memory structure of the high end server shown in FIG. 2A.

FIG. 2B shows a block diagram of the memory structure of the high end server shown in FIG. 2A. In the high end server shown, the data bus is 144 bits wide where 128 bits are used for data and 16 bits are used for error correction. Preferably each memory module Includes eighteen memory devices (N=18), each memory device being 4 bits wide. For each memory module, the eighteen×4 memory devices are connected in parallel. Data is read from two memory modules simultaneously, so that for each memory operation, the output onto the data bus 214 is 144 bits wide.

Figure 2C:
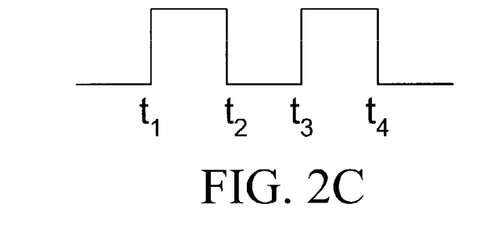
FIG. 2C shows a clock signal for reading or writing to a memory location of the low end server shown in FIG. 2A.

Referring to FIG. 2C shows a clock pulse for reading or writing to a memory location of the high end server shown in FIG. 2A. The memory controller reads a single word or memory location from a single memory module at a time. Assuming a double data rate (DDR) system and a memory read operation, the memory location in memory module 208a having the address 000000 and the memory location in memory module 208e having the address 000000 are both read simultaneously at the clock edge $t_1$. A second memory location in memory module 208a having the address location 000001 and a second memory location having the address 000001 in memory module 208d are both read simultaneously at the clock edge $t_2$.

The current trend of increasing memory size is likely to continue. Microprocessor suppliers continue to supply higher speed CPUs. With increases in CPU speed come increased speed in the CPU bus and supporting I/O systems and a corresponding increase in server memory size per CPU since more users per CPU can be supported. As the size of memory systems increases, the probability of a memory bit failing, and thus the memory system failing, increases. Customers are demanding improved error correction features to deal with these increases in memory failures even for low end systems.

One error correction feature that was traditionally not supported in low servers is what is known in the industry as chipkill. The term chipkill traditionally refers to the ability to correct multiple bit errors in memory, where the multiple bit error is the width of the memory device. For example, for a 32 Mbit SDRAM that is 4 bits wide, a system that supports the chipkill function would be able to correct a 4 bit wide error in the memory device. Thus, the failure of an entire SDRAM chip organized in a×4 configuration in a system that supports chipkill would not cause the system to fail.

Chipkill is provided in high end chipsets, for example, by combining two DIMMs into a 144 bit bus that includes 128 data bits and 16 ECC bits where ECC stands for error correcting or error checking and correcting codes. The number of bits that can be corrected, typically depends on the number of ECC bits supported by the system. ECC or error correction code refers to a commonly used error detection and correction process that is typically based on a CRC (cyclic redundancy code) algorithm. CRC algorithms work so that when data is received, the complete data sequence (which includes CRC bits appended to the end of the data field) are read by a CRC checker. The complete data sequence should be exactly divisible by a CRC polynomial.

If the complete data sequence is not divisible by a CRC polynomial, an error is deemed to have occurred.

Supporting the chipkill function based on an ECC process typically requires additional error correction bits where the number of bits corrected depends on the number of ECC bits supported by the system. For example, typically the CRC algorithm used to correct for a 4 bit wide memory organization requires more than the eight error correction bits that are provided by the low end server shown in FIG. 1A. Thus, to perform the chipkill function for a×4 organization, the low end server would require additional memory modules or devices to provide the additional ECC bits necessary to perform the required CRC algorithms. However, because the CRC algorithm typically used to correct for a 4 bit wide memory organization does not require more than the 16 error correction bits supported by the high end server shown in FIG. 2A, the high end server could support the chipkill function.

An alternative implementation available to low end server systems that wish to provide chip kill error correction is to provide a custom ASIC, such as that currently made commercially available from IBM Corporation, that provides specialized logic. The custom ASIC uses a specialized controller, and a memory wider than 72 bits, i.e. 80 bits to provide 16 ECC bits and uses fast SDRAM. This is twice the number of ECC memory normally required which limits the maximum memory size, since additional memory is required for ECC memory. Although the custom ASIC provides chipkill functionality, it is comparatively expensive and it would be preferable to use standard components if available. Further, currently available ASICs have limited memory sizes available and may not work at the 133 MHz speed required for next generation bus systems.

A memory system configuration and process that provides chipkill error detection in a low end server system that does not require costly custom ASIC chips or additional memory modules or devices to provide the additional ECC bits necessary to perform the required CRC algorithms is needed.

SUMMARY OF THE INVENTION

The present invention provides a process and memory configuration for providing chipkill error detection in a low end server without requiring non-standard components or additional memory devices. Typically for semiconductor memory devices, error detection and correction is performed using ECC error correction. To perform ECC correction, a predetermined number of bits in a specified memory device must be available for error correction. Typically, the number of error correction bits required for chipkill functionality is dependent on the width of the memory chip to be corrected and the CRC algorithm that is used. If the required number of error correction bits is not provided by the memory system, another option according to the present invention, is to perform doubleword operations for consecutive memory locations in a single DIMM module. Reading the memory module in double words basically provides the system with double its previous number of available ECC bits per data transfer. Since these low end systems would typically not have the number of error correction bits necessary to do the chipkill operation, this double word technique allows chipkill to be supported in low end systems which would normally not be able to perform the chipkill operation.

Using doubleword read and/or writes in combination with the described memory configuration allows the chipkill operation to be performed with minimal system performance impact and without increasing system costs for the cost sensitive low end server or workstation applications. The implementation according to the present invention does not require a custom memory module and is not limited certain memory module sizes as are today's commercially available custom ASICs.

For server applications, the double word implementation uses the DDR extra bandwidth that would otherwise be wasted, to "hide" the overhead for the chipkill operation. When used in the low end server applications, the performance penalty of reading double words (16 B data, 2 B ECC) is minimized by the bandwidth of the memory system being two times the system bus bandwidth. In a PC or workstation, this bandwidth is used for non-cache coherent AGP accesses to memory, not applicable in a server. Therefore the overhead for R-M-W used in byte write operation is hidden and bandwidth that would otherwise be wasted is used. Further, the present invention can provides the same chipkill functionality that it provides in a server system in a PC chipset with minor memory controller changes without requiring additional parts or custom parts.

In determining whether to implement the doubleword read, the system user implementing the system must first determine whether or not chipkill is a desired function. If the chipkill function is desired there should be a determination if the number of error correction bits need to support the target memory width of the chip is already provided by the error correction bits in a single memory address. If the number of error bits required is already provided, there is no need to a doubleword operation. Otherwise, the memory locations in a single memory module can be read or written in double words. Reading the memory module in double words basically provides the system with double its previous number of ECC per data transfer. This increased number of error correction bits may be adequate to perform a chip kill operation for the targeted chip width.

A further understanding of the nature and advantages of the present invention may be realized with reference to the remaining portions of the specification and the attached drawings.

DETAILED DESCRIPTION OF THE PREFERRED EMBODIMENTS

The present invention provides a method for providing chipkill functionality to a memory configuration that includes a memory controller and at least one memory module. The memory module preferably includes a plurality of memory devices having a target width. According to the present invention, double word memory operations are initiated by the memory controller in order to provide an adequate number of error correction bits to provide chipkill functionality.

Figure 3A:
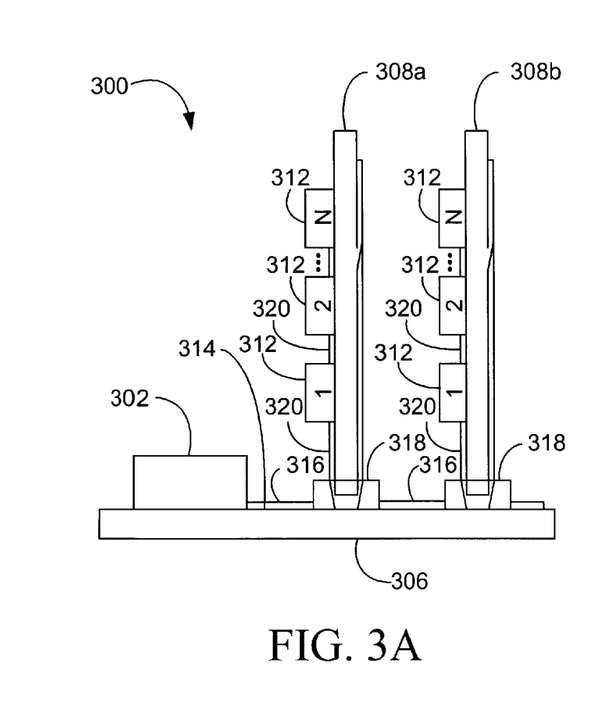
FIG. 3A shows a side view of a memory system for a low end server that includes two memory modules according to the present invention.

Referring to FIG. 3A shows a side view of a memory system for a low end server system 300 that includes two memory modules. The memory system includes a CPU or memory controller 302 affixed to a motherboard 306 and two dual in line memory modules 308a and 308b. The two memory modules 308a–b each includes N memory devices 312 preferably connected in series. Assuming for purposes of discussion that N is equal to eighteen, the eighteen memory devices 312a–N on the memory module 308a–b are connected to the memory controller 302 by a data bus 314, which includes board trace portions 316, a connectors 318 and a module trace portions 320.

Figure 3B:
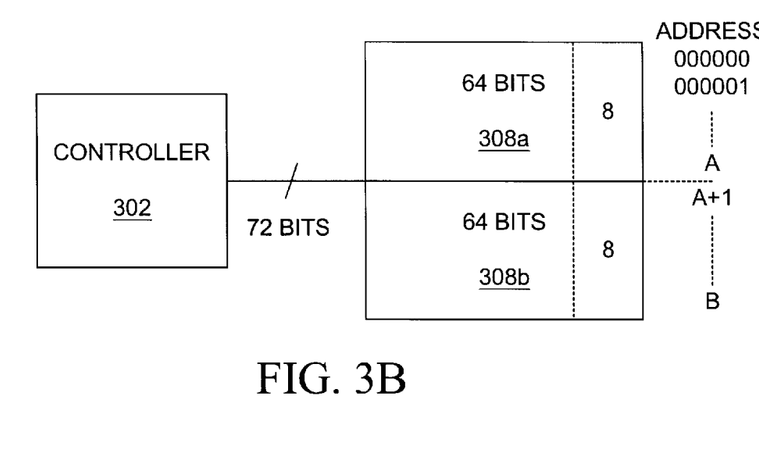
FIG. 3B shows a block diagram of the memory structure of the memory modules of the low end server shown in FIG. 3A.

FIG. 3B shows a block diagram of the memory structure of the memory modules of the low end server shown in FIG. 3A. In the embodiment shown in FIG. 3B, although each DIMM modules is 72 bits wide, double word operations result in a data bus that has an effective width of 144 bits wide where 128 bits are used for data and 16 bits are used for error correction. Each of the eighteen memory devices on the memory modules 308a–b is 4 bits wide and for a 256 Mbit system each of the eighteen×4 SDRAMs is 32 Mbyte.

Figure 3C:
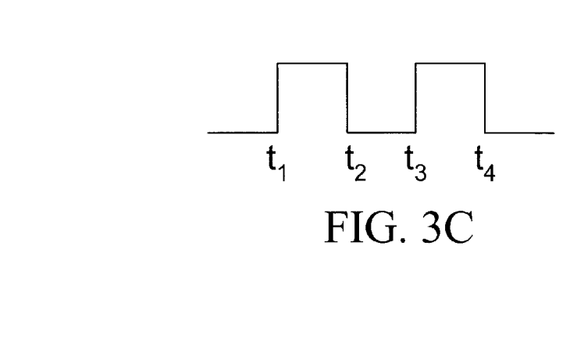
FIG. 3C shows a clock signal for reading or writing to a memory location of the low end server shown in FIG. 3A.

Referring to FIG. 3C shows a clock pulse for reading or writing to a memory location of the low end server shown in FIG. 3A. The memory controller 302 simultaneously reads a double word from a single memory module. Assuming a double data rate (DDR) system and a read operation, the memory location in memory module 308 having the address 000000 is read at the clock edge $t_1$. The contents of memory address 000000 is 72 bits wide. Because the present invention operates on double words, the contents of a second memory location having the address location 00000001 in the same memory module 308a is then read at the clock edge $t_2$. The contents of memory location 00000001 are also 72 bits wide. Thus, at clock edge $t_2$ a total of 144 bits are read from the data bus (72 bits from memory location 00000 and 72 from memory location 000001.)

Using doubleword read and/or writes in combination with the described memory configuration allows the chipkill operation to be performed with minimal system performance impact and without increasing system costs for the cost sensitive low end server or workstation applications. The implementation according to the present invention does not require a custom memory module and is not limited certain memory module sizes as are today's commercially available custom ASICs.

For server applications, the double word implementation uses the DDR extra bandwidth that would otherwise be wasted, to "hide" the overhead for the chipkill operation. When used in the low end server applications, the performance penalty of reading double words (16 B data, 2 B ECC) is minimized by the bandwidth of the memory system being two times the system bus bandwidth. In a PC or workstation, this bandwidth is used for non-cache coherent AGP accesses to memory, not applicable in a server. Therefore the overhead for R-M-W used in byte write operation is hidden and bandwidth that would otherwise be wasted is used. Further, the present invention can provide the same chipkill functionality that it provides in a server system in a PC chipset with minor memory controller changes without requiring additional parts or custom parts.

Overall the chipkill features provided are similar to the high end system without incurring a performance or cost penalty. However, although the doubleword implementation is substantially transparent to the system with respect to performance and system costs, the doubleword implementation will modify system output in some cases compared to cases where single word operation occurs. For example, in the case of a DIMM connector data pin failure, the double read operation will cause a double bit error in the implementation according to the present invention but this can be corrected with CRC error correction methods.

With respect to replacement of DIMM modules, typically for low end systems it is not realistic to provide a hot spare modules and basic error correction techniques and the basic failure immunity can be relied upon until a service downtime interval to replace a failed DIMM or a hot spare can be provided. Depending on the CRC polynomial and SDRAM organization used, failures in the memory could be corrected and then rebuilt on the hot spare or simply corrected and then the DIMM replaced at the next annual server downtime period. In a 3–4 DIMM PC server system could use a DIMM for a hot spare if the complexity of handling "rebuild" is minimized.

Figure 4A:
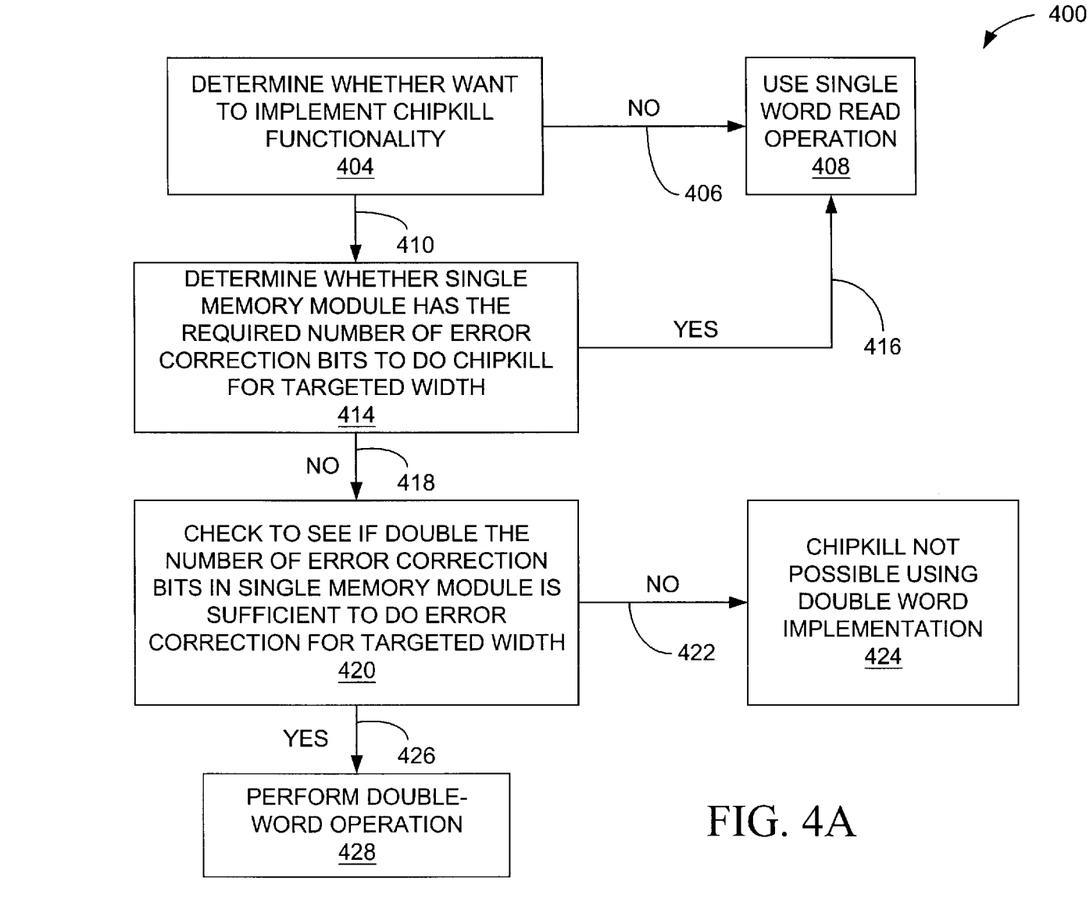
FIG. 4A shows a flowchart of the steps for determining whether to implement chipkill in a low end server.

FIG. 4A shows a flowchart 400 of the steps for determining whether to implement chipkill in a low end server. In determining whether to implement the doubleword read, it should first be determined by the system implementor determine whether or not chipkill is a desired function (step 404). If chipkill function is not desired (step 406), then single word operations that are used in prior art systems would be acceptable (step 408).

If chipkill functionality is desired (step 410), then there should be a determination if the number of error correction bits provided by a single memory location of the memory module is sufficient to support chipkill for desired width of memory device (step 414). Different algorithms for performing chipkill are well known and the particular algorithm chosen determines the number of error correction bits that are required. If the number of error correction bits required is already provided (step 418), then there Is no need to a doubleword operation as the single word operation would support chipkill functionality. If the number of bits required is not already provided (step 418), a check can also be performed to determine whether double number the bits would provide a sufficient number of error correction bits (step 420), if not (step 422) chipkill Is not possible using the double word implementation of the present Invention (step 24). Otherwise, the memory locations in a single memory module can be read or written in double words (step 428). Reading the memory module in double words basically provides the system with double its previous number of ECC per data transfer.

The method recited in FIG. 4A could also be used by the memory controller to determine whether to implement single word memory operations or a double word memory operations. In the preferred embodiment, the memory controller would determine whether a single word or double word implement would performed during system initialization. In one embodiment, the implementation chosen is be based upon a switch indicator where the switch indicator indicates whether or not enough bits are present in the single word configuration to perform the chipkill algorithm. Alternatively, the memory controller could switch automatically between single word memory operations and double word memory operations dependent upon a switch indicator.

Figure 4B:
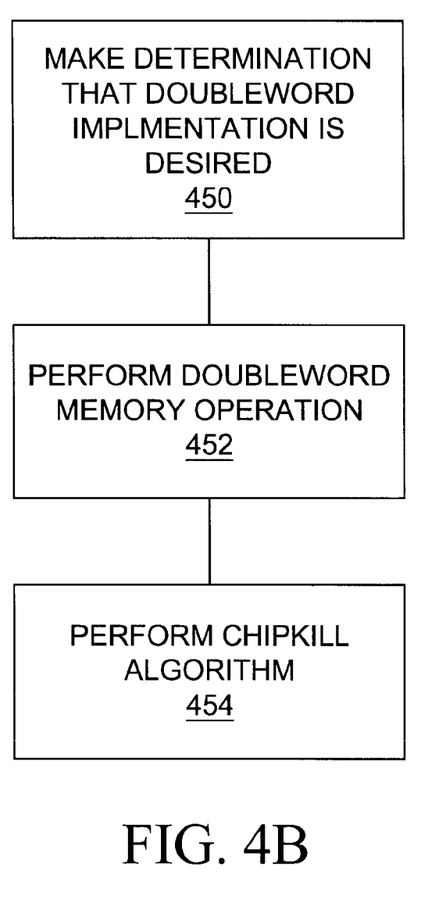
FIG. 4B shows a flowchart of the steps for implementing chipkill in a low end server which does not support chipkill when utilizing single word memory operations.

FIG. 4B shows a flowchart of the steps for implementing chipkill in a low end server which does not support chipkill when utilizing single word memory operations. First, a determination is made that a doubleword memory implementation is desired (step 450). Preferably this step is performed before system initialization using steps 404–426 of the method shown in FIG. 4A. Next, if a double word memory implementation is desired a double word memory operation is performed (step 452). After the double word memory operation is performed to gather the required data, the chipkill algorithm is performed (step 454).

It is understood that the above description is intended to be illustrative and not restrictive. For example, the same principles recited in this application could be applied to mid range systems having a 144 bit bus (128 bits data, 16 bits ECC) where the system implementation requires a 288 bit system with 32 ECC bits and a cache line of 128 bytes compared to the described implementation. The double words in this case would be 256 bits data and 32 bits ECC with a burst length of 8. Further, the present invention may be used in combination with the configuration or processes disclosed in the related applications which are herein incorporated by reference. The scope of the invention should therefore not be determined with reference to the above description but instead should be determined with reference to the appended claims along with the full scope of equivalents to which such claims are entitled.

What is claimed is:

1. A method of performing memory operations in a single memory module in a computer system when it is determined that the number of bits in a single memory module dedicated to error correction is less than the number of bits required to perform a chipkill correction algorithm supported by the computer system, comprising the steps of:

combining contiguous data bits into a word that is twice the data width of the memory module;

generating error correction code by performing the chipkill correction algorithm on the word; and writing a portion of the word and a portion of the error correction code to a first memory location and the remainder of the word and the remainder of the error correction code to a consecutive memory location.

2. The method recited in claim 1 further including the further step of performing the double word memory operation within one clock cycle.

3. A memory configuration comprised of:

a memory controller;

a data bus;

at least one memory module, wherein the at least one memory module is electrically coupled to the memory controller by the data bus, wherein the at least one memory module includes at least one memory device, the memory controller being operable, when the number of bits in a single memory module of the computer system that are dedicated to error correction is less than the number of bits required to perform a chipkill correction algorithm supported by the computer system, to:

combine contiguous data bits into a word that is twice the data width of the memory module;

generate error correction code by performing the chipkill connection algorithm on the word: and write a portion of the word and a portion of the error correction code to a first memory location and the remainder of the word and the remainder of the error correction code to a consecutive memory location.

4. The memory configuration of claim 3, wherein the double word memory operation is performed within one clock cycle.

5. A method for performing memory operations in a single memory module in a computer system, when it is determined that the number of bits in a single memory module dedicated to error correction is less than the number of bits required to perform a chipkill correction algorithm supported by the computer system, comprising the steps of:

performing a double word memory operation in a single memory module;

using the additional error correction bits provided by the double word memory operation to perform the desired chipkill algorithm supported by the computer system; and determining whether a double word memory operation implementation is desired, wherein the step of determining whether a double word memory operation implementation is desired Is performed before the step of performing a double word memory operation.

6. The method recited in claim 5, further including the stop of determining whether the computer system user wishes to perform the chipkill algorithm.

7. The method recited in claim 6 further including the step of determining whether the single memory module has the required number error correction bits to perform the chipkill algorithm for the memory devices in the single memory module.

8. The method recited in claim 6 further including the step of determining whether the number of bits required by the computer system to perform the chipkill algorithm is less than or equal to double the number of error correction bits available in the single memory module.

9. The method recited in claim 5 wherein the computer system has the ability to switch between a single word memory implementation and a double word memory implementation.

\* \* \* \* \*

UNITED STATES PATENT AND TRADEMARK OFFICE
CERTIFICATE OF CORRECTION

PATENT NO. : 6,493,843 B1
DATED : December 10, 2002
INVENTOR(S) : Michael B. Raynham It is certified that error appears in the above-identified patent and that said Letters Patent is hereby corrected as shown below:

Column 8,
Line 37, delete "Is" and insert therefor -- is --

Signed and Sealed this

Twelfth Day of April, 2005

JON W. DUDAS
*Director of the United States Patent and Trademark Office*